United States Patent [19]

D'Arrigo et al.

[11] Patent Number: 5,432,740

[45] Date of Patent: Jul. 11, 1995

[54] LOW VOLTAGE FLASH EEPROM MEMORY CELL WITH MERGE SELECT TRANSISTOR AND NON-STACKED GATE STRUCTURE

[75] Inventors: Iano D'Arrigo, Cannes; Georges Falessi, La Gaude, both of France; Michael C. Smayling, Missouri City, Tex.

[73] Assignee: Texas Instruments Incorporated, Dallas, Tex.

[21] Appl. No.: 135,813

[22] Filed: Oct. 12, 1993

[51] Int. Cl.⁶ .............................................. G11C 7/00
[52] U.S. Cl. ................... 365/185; 257/316; 257/317; 257/320; 257/321; 365/900
[58] Field of Search ............... 365/185, 900; 257/321, 257/320, 319, 317, 316, 104

[56] References Cited

U.S. PATENT DOCUMENTS

| | | | |
|---|---|---|---|
| 5,033,023 | 7/1991 | Hsia | 365/185 |
| 5,040,147 | 8/1991 | Yoshizawa | 365/185 |
| 5,111,270 | 5/1992 | Tzeng | 257/321 |

*Primary Examiner*—Joseph A. Popek
*Assistant Examiner*—Son Mai
*Attorney, Agent, or Firm*—Richard L. Donaldson; Jay M. Cantor; William E. Hiller

[57] ABSTRACT

A EEPROM memory array (10) includes a plurality of memory cells (24) which are connected in a symmetric array between row lines (26) and Column Lines (28) and Virtual Ground Lines (29). Each of the memory cells includes a merged pass gate which is connected to a control gate. A non-stacked structure is utilized wherein a floating gate (42) is formed, having two portions that extend over an active region, a tunnel diode portion (44) and a control gate portion (46). The floating gate portion (44) is disposed over a thin tunnel oxide layer (47) to form a tunnel diode which allows Fowler-Nordheim tunneling to occur. The control gate portion (46) is disposed over a much thicker oxide layer such that tunneling does not occur. A control gate layer (50) is disposed over the floating gate (42) such that it overlaps the edges thereof and encloses the floating gate (42). On the one side of the floating gate (42), the control gate extends over the gate oxide layer in an extended portion (52) to form a pass gate structure. The pass gate structure is a merged structure formed in series with the floating gate cell. The merged pass gate has a controllable threshold that allows the floating gate cell to be overerased without causing unwanted conduction when the cell is unselected.

9 Claims, 4 Drawing Sheets

LOW VOLTAGE FLASH EEPROM MEMORY CELL WITH MERGE SELECT TRANSISTOR AND NON-STACKED GATE STRUCTURE

CROSS REFERENCE TO RELATED APPLICATIONS

The present invention is related to U.S. patent application Ser. No. 08/135,694, copending herewith, which is entitled "Memory Array Utilizing Low Voltage Fowler-Nordheim Flash EEPROM Cell," U.S. patent application Ser. No. 08/135,695, copending herewith, which is entitled "Low Voltage Flash EEPROM X-Cell Using Fowler-Nordheim Tunneling" and U.S. Pat. No. 08/135,696, copending herewith, which is entitled "Low Voltage Fowler-Nordheim Flash EEPROM Memory Array Utilizing Single Level Poly Cells."

TECHNICAL FIELD OF THE INVENTION

The present invention pertains in general to an erasable, electrically programmable memory cell (EEPROM) and its related driving circuitry and, more particularly, to an EEPROM cell utilizing a merged control transistor and Fowler-Nordheim tunnel diode for low voltage operation

BACKGROUND OF THE INVENTION

Conventional EEPROMs typically employ three to four transistors, which include a tunnel diode device coupled to the floating gate of the sense transistor to charge the latter and a select or row transistor to activate the cell. The use of three or four transistors to realize a cell substantially limits the size reduction possible for EEPROM arrays. Furthermore, typical EEPROM cells require the application of voltages in excess of 15 volts. This therefore requires special processing to reduce leakage and a larger layout to avoid unwanted field transistor turn-on, i.e., the use of high voltage transistors typically have longer channel lengths, and therefore, significantly larger sizes. This is especially the case with respect to the row transistor, since high voltage is applied to the source during the ERASE mode. The peripheral driving circuitry also requires higher voltage transistors to handle these high voltage driving signals.

The row transistor for the memory cell is typically referred to as a "select" transistor that is utilized to isolate the memory cell from the Column or Bit Line. Further, when the row transistor is utilized in combination with an EEPROM cell of the Fowler-Nordheim type, the row transistor allows for a wide range of threshold voltages on the memory cell transistor. Typically, a memory cell transistor is comprised of a stacked confirmation wherein a floating gate is isolated from the channel region of the transistor by a thin layer of gate oxide with a thickness less than 100 Å. A layer of interlevel oxide is then disposed over the surface of the floating gate and a then a control gate disposed over the interlevel oxide. During fabrication, these structures are formed with a double level poly process such that two layers of polycrystalline silicon are disposed on the substrate, separated by the interlevel oxide and then patterned and etched to define a stacked gate structure. In this structure, the lateral edges of the control gate are aligned with the lateral edges of the floating gate in a self-aligned gate process. Thereafter, the stacked gate structure is utilized to mask off a channel region during implanting of the source/drain regions. One disadvantage to the stacked gate structure is the control of its threshold voltage. During an ERASE operation, when the floating gate is positively charged, the threshold can actually go negative. If the row transistor were not utilized, this could cause unwanted conduction in non-selected rows. However, the threshold voltage of the row transistor, when disposed in parallel with the memory cell transistor, prevents this unwanted turn on since, when the gate of the row transistor is low, the row transistor will remain off, regardless of the conductivity of the memory cell transistor. However, one disadvantage to the utilization of the row transistor is the lack of symmetry in the array and the necessity for additional select lines for each row of memory cells and the use of a relatively high voltage transistor for the row transistor.

SUMMARY OF THE INVENTION

The present invention disclosed and claimed herein comprises a Flash EEPROM memory having a memory array of EEPROM memory cells arranged in rows and columns on the face of a semiconductor substrate of a first conductivity type. Each of the memory cells is comprised of an active region having a channel region defined therein with source and drain regions defined on either side of the channel region. A floating gate structure is provided having a control gate portion extending over a portion of the channel region and a tunnel diode portion extending over one of the source-and-drain regions. A tunnel oxide layer is disposed between the tunnel diode portion and the active region to allow for Fowler-Nordheim electron tunneling therethrough. A gate oxide region is disposed between the control gate portion and the channel region. A control gate structure is disposed over the floating gate structure and separated therefrom by a layer of interlevel oxide. The control gate structure overlaps and extends away from the floating gate structure within the channel region to provide an overlapping portion that extends over substantially all of the remaining channel region not covered by a floating gate structure to form a pass transistor that is in series with the floating gate transistor formed by the control gate structure, the floating gate structure and the channel region.

In another aspect of the present invention, the tunnel diode portion of the floating gate structure extends over the source region. The source region is divided into three doped regions, a first doped region of second conductivity type of material abutting the channel region, a tunnel diode doped region of second conductivity type material adjacent the first doped region and a third doped region of second conductivity type material disposed opposite the tunnel diode region from the first doped region. The tunnel oxide layer is disposed over the tunnel diode region, over which the tunnel diode portion of the floating gate structure is disposed. The tunnel diode is therefore disposed in series with the floating gate transistor, the resistance of the tunnel diode doped region being greater than the resistance of the first and second doped regions.

In a further aspect of the present invention, the floating gate structure is formed from a first layer of poly having a first thickness and the control gate structure is formed of a second layer of poly having a second thickness. The second layer of poly is patterned such that it overlaps substantially all edges of the first poly layer forming the floating gate structure. The overlapping portion extends outward from the edge of the first poly layer with a width that is greater than approximately three times the thickness of the first poly layer.

In yet another aspect of the prevent invention, the active region is disposed within a tank of first conductivity type material which is biased at a voltage to prevent forward biasing of the semiconductor junction between the source and drain regions and the first conductivity type tank for all voltages that can be applied to the source and drain regions. The first conductivity tank is disposed within a second conductivity type tank which is biased at a voltage to prevent forward biasing of the semiconductor junction between the first conductivity type tank and the second conductivity type tank.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
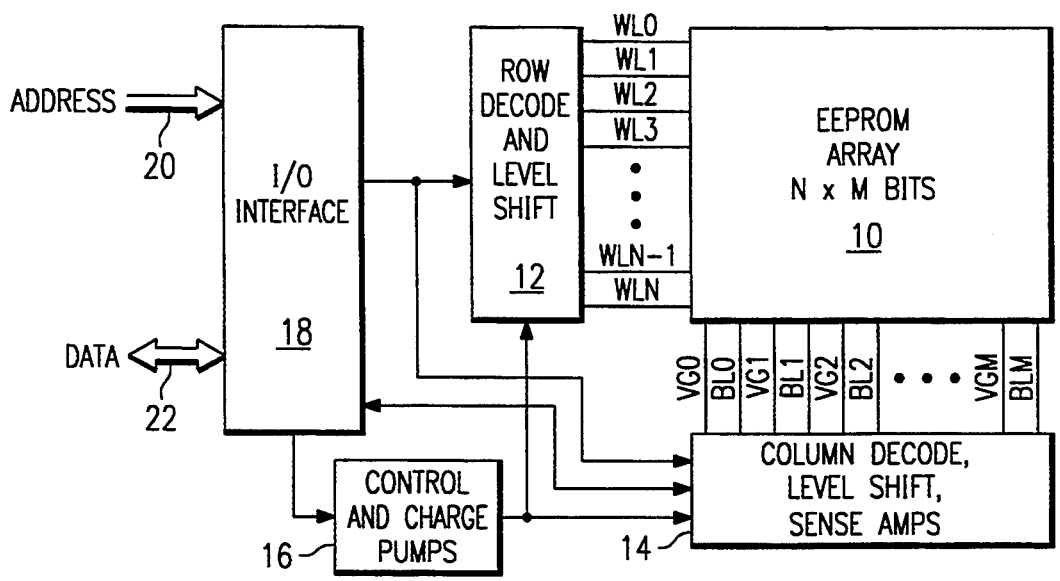
FIG. 1 illustrates a block diagram of the EEPROM.

Referring now to FIG. 1, there is illustrated a schematic block diagram of the architecture of an EEPROM memory which may stand alone as an independent integrated circuit, as well as being incorporated within a much higher level integrated circuit as a single module in that integrated circuit. The EEPROM memory includes an array 10 of memory cells which are arranged as N-rows and M-columns to provide an array of N×M bits. In a typical example, the array could be arranged to have 256 words with 8 bits per word, for a total of 2048 bits. These may be organized in an array of, for example, 32 rows by 64 columns, or 64 rows by 32 columns.

Each of the bits in the array 10 is associated with an EEPROM memory cell, as will be described hereinbelow. Each of the memory cells requires a dedicated Word Line and Bit Line with adjacent Word Lines and Bit Lines also utilized in the programming, as will also be described hereinbelow. A row decoder and level shifter 12 is provided for interfacing with the Word Lines to drive the Word Lines to the appropriate voltages. A column decoder, level shifter and sense amplifier section 14 is operable to drive the Bit Lines with the appropriate voltages and, during the Read operation, to attach the appropriate Bit Lines to sense amplifiers.

A block 16 includes circuitry for controlling the timing of the access to the EEPROM array 10 and charge pumps for providing control signals and appropriate voltages to the array 10, the row decode and level shift block 12 and the column decode, level shift and sense amplifier section 14. The control and charge pump block 16 is connected to an input/output (I/O) interface 18, which provides an interface with either the rest of the chip or with an external chip or device to receive address signals therefrom and also input and output data. The I/O interface 18 uses addresses from an address bus 20 and receives data from and transfers data to a data bus 22.

Figure 2:
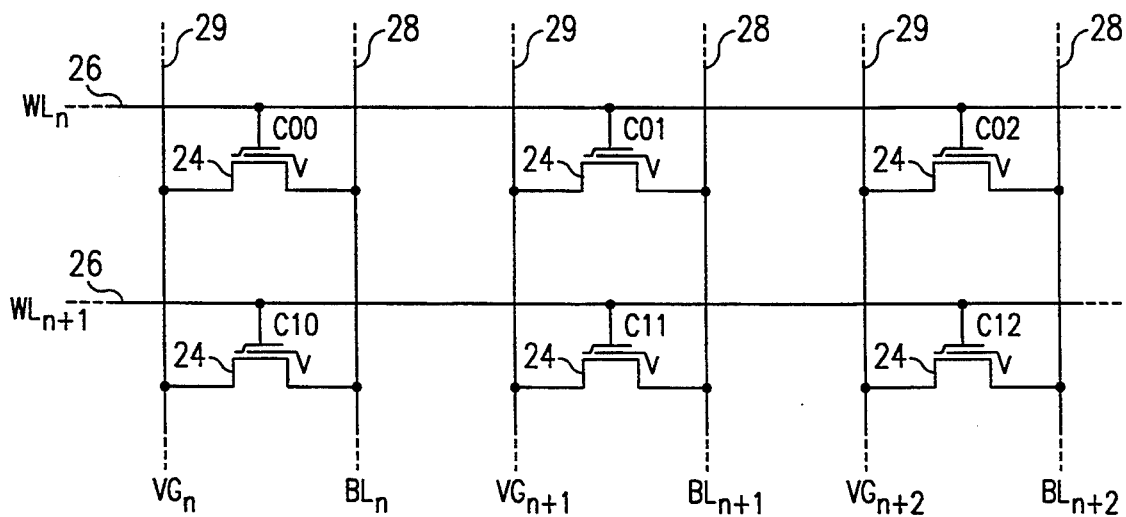
FIG. 2 illustrates a schematic diagram of the array.

Referring now to FIG. 2, there is illustrated a detailed diagram of the array. A plurality of EEPROM transistor cells 24 are provided which are arranged in rows of columns and incorporate the use of a floating gate transistor memory cell that utilizes Fowler-Nordheim tunneling for the programming operation thereof. A plurality of Word Lines 26 are provided, one associated with each row of memory cells 24, the Word Lines 26 connected to the control gates of the respective memory cells 24. A plurality of Column Lines 28 are provided, each associated with a column of the memory cells 24 and connected to the drains of the associated memory cells. Each of the Column Lines is designated as a Bit Line BL0, BL1 ... BLN. Additionally, a plurality of Virtual Ground Lines 29 are provided, each associated with one column of the memory cells 24. Each of the Virtual Ground Lines 29 are connected to the sources of the associated memory cell transistors 24 in the associated column. The Virtual Ground Lines 29 are each labelled VG1, VG2 ... VGN.

In the example of FIG. 2, there are illustrated two Word Lines $WL_n$ and $WL_{n+1}$, three Bit Lines $BL_n$, $BL_{n+1}$ and $BL_{n+2}$, and three Virtual Ground Lines $VG_n$, $VG_{n+1}$ and $VG_{n+2}$. Memory cell transistors 24 associated with the Word Line $WL_n$ are labelled C00, C01 and C02, for each of the respective Bit Lines $BL_n$-$BL_{n+2}$. Further, the three memory cell transistors 24 associated with the Word Line $WL_{n+1}$ are labelled C10, C11 and C12.

In order to Write to the cells, i.e., to negatively charge the floating gates, it is necessary to dispose the Word Lines 26 at a positive voltage, and the sources and drains of the memory cell transistors 24 at a negative voltage, to allow electrons to tunnel from the source side of each of the memory cells 24 to the floating gates thereof. This can be achieved in two ways. In one method, a high voltage level of approximately 18 volts can be disposed on all of the Word Lines 26, with the Column Lines 28 and Virtual Ground Lines 29 disposed at ground or zero volts. Alternately, and in the preferred embodiment, Word Lines 26 are disposed at a medium voltage of approximately 9 volts and the Column Lines 28 and Virtual Ground Lines 29 disposed at a negative medium voltage of −9 volts. In order to FLASH ERASE the cells, it is only necessary to dispose the Word Lines 26 at the negative medium voltage and the Column Lines 26 at the positive medium voltage.

In the programming mode of the present invention, the array is first subjected to a FLASH ERASE operation, and then a select cell subjected to a WRITE operation. In order to selectively WRITE one of the memory cell transistors 24, such that individual bit programming can be provided, it is necessary to dispose a positive voltage on the control gate of a select transistor relative to source and drain thereof. However, it is also important that the remaining voltages of the sources and drains of adjacent cells and other cells in the array be disposed at a voltage such that the charge on the floating gates thereof is not disturbed for unselected cells.

For example, consider the memory cell transistor 24 labelled C11. The following Table 1 illustrates the voltages necessary for the FLASH WRITE, the WRITE, the READ and FLASH ERASE operations.

TABLE 1

| MODE | WL$_n$ | WL$_{n+1}$ | VG$_n$ | BL$_n$ | VG$_{n+1}$ | BL$_{n+1}$ | VG$_{n+2}$ | BL$_{n+2}$ |
|---|---|---|---|---|---|---|---|---|
| Flash Write | +MV | +MV | MV | −MV | −MV | −MV | −MV | −MV |
|  | +HV | +HV | 0V | 0V | 0V | 0V | 0V | 0V |
| Write C11 | +HV/2 | +HV | Float | +HV/2 | Float | 0V | Float | +HV/2 |
| Read C11 | −Vr | +Vr | 0 | Float | Ov | Vs | 0 | Float |
| Flash Erase | −MV | −MV | Float | +MV | Float | +MV | Float | +MV | where:
HV = High Voltage (18 V)
MV = Medium Voltage (9 V)
Vr = Word Line Read Voltage (5 V (V$_{DD}$))
Vs = Bit Line Sense Voltage (1.2 V)

Initially, the Word Lines are all disposed at a positive medium voltage of, for example, 9 V and the Bit Lines disposed at a negative medium voltage of, for example, −9 V to remove all the negative charge from the floating gates of all of the memory cell transistors 24. The negative medium voltage may have the level thereof adjusted to ensure that the cells are not over erased, i.e., the threshold voltage thereof does not go negative. To Write to cell C11, the Word Line WL$_{n+1}$ is disposed at a high voltage of +18 V and the remaining Word Lines are disposed at a voltage of one half the high voltage, or +9 V. The Bit Line BL$_{n+1}$ is disposed at a value of zero volts, with the remaining Bit Lines disposed at a voltage of one half the high voltage, or +9 V, and all of the Virtual Ground Lines are allowed to float. Therefore, the tunnel diode of cell C11 will have a voltage of +18 volts disposed thereacross for the purpose of depleting charge from the associated floating gate without requiring the high node potentials necessary for a normal EEPROM cell. However, it is important to ensure that the other memory cells C10 and C12 in the same row having the control gates thereof attached to the Word Line WL$_{n+1}$, do not have the charge on the floating gates thereof disturbed, this referred-to as a "write disturb" operation. This is achieved by disposing the Bit Lines associated with the non-selected cells in the row associated with Word Line WL$_{n+1}$ at the +9 V level, such that only +9 V is disposed across the associated tunnel diode of the non-selected cells. As such, the voltage is at an insufficient level to cause tunneling in the Fowler-Nordheim configuration.

With respect to the remaining cells on non-selected Word Lines, it can be seen that, since the voltage utilized on the Word Lines of the non-selected cells is one half the high voltage level, with the associated Bit Lines of the non-selected cells disposed at a zero voltage level, there will be a lower voltage across the tunnel diode as compared to that of the selected cell C11. As such, the voltage is at an insufficient level to cause tunneling in the Fowler-Nordheim configuration. Alternatively, the Word Line of C11 could be disposed at a positive medium voltage of, for example, +9 V for the WRITE operation and the remaining Word Lines at a voltage of 0 V, with the Bit Line of the selected cell disposed at a negative medium voltage of, for example, −9 V, and the Bit Lines of the non-selected cells disposed at a zero voltage level. The use of the negative voltage and the positive voltage as opposed to ground and a single positive programming voltage allows the array to operate in a bit-programming mode without requiring the use of a separate control transistors and, thus, allows for much smaller array size.

Figure 3:
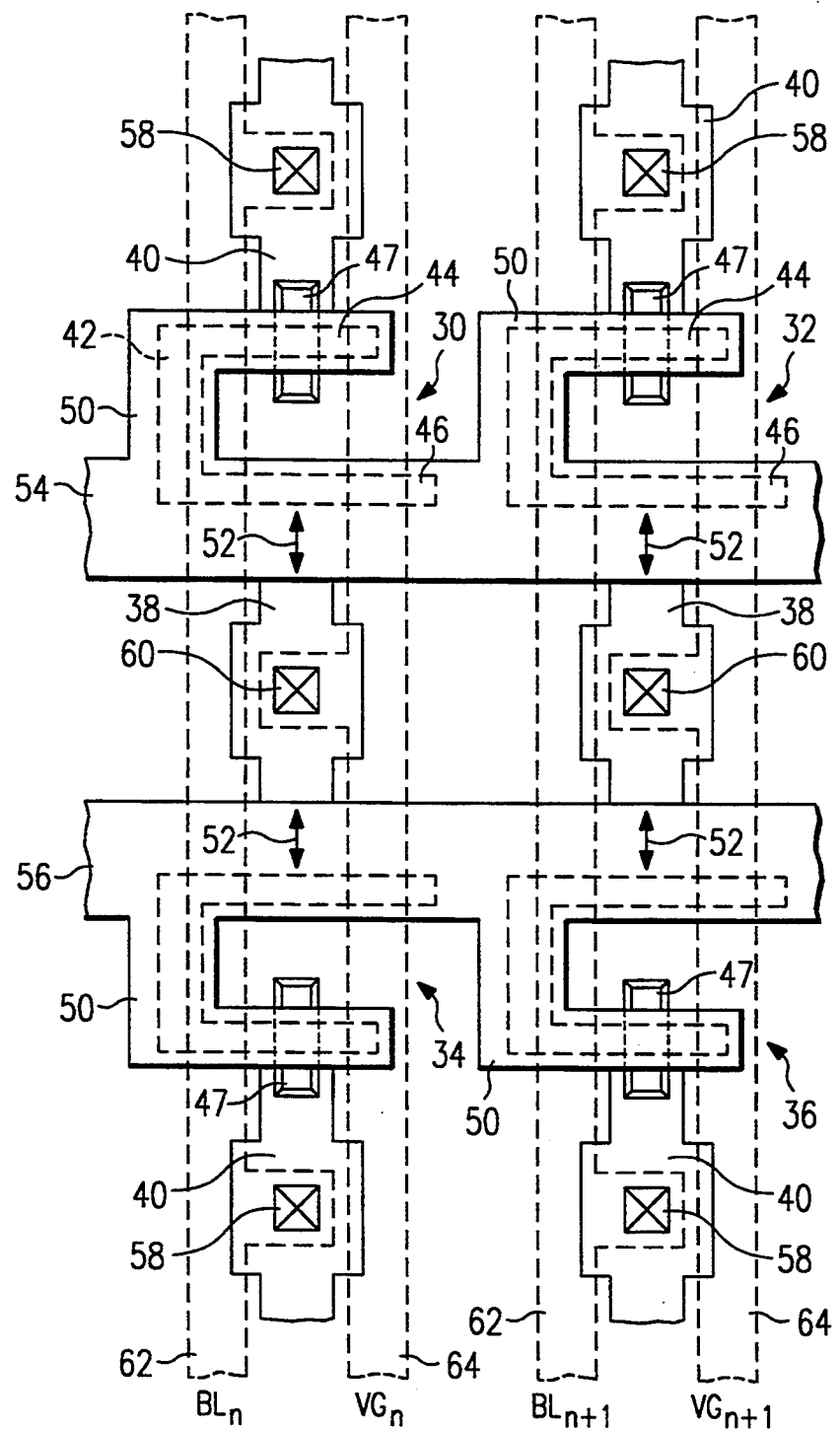
FIG. 3 illustrates a plan view of the cell-layout for the array.

Referring now to FIG. 3, there is illustrated a plan view of the memory array illustrating four memory cell transistors, a transistor 30, a transistor 32, a transistor 34 and a transistor 36, transistors 30 and 32 being in a common row and transistors 34 and 36 being in a common row, transistors 30 and 34 being in a common column and transistors 32 and 36 being in a common column. Each transistor has associated therewith a source diffusion region 38, which is connected to the Virtual Ground Lines 64 and a drain diffusion region 40 connected to the Bit Lines 62. The transistors are arranged such that each source diffusion region 38 is shared by two transistors in a common column and each drain diffusion region 40 is shared by two transistors in a common column. The drain diffusion regions 40 are formed within an active region that extends along the associated column.

A floating gate structure 42 is provided that has two portions, a first tunnel diode portion 24 and a second control gate portion 46. The tunnel diode portion 44 extends over the active region adjacent the drain diffusion region 40 and is separated from the active region by a thin tunnel oxide layer 47 having a thickness of approximately 100 Å. This tunnel oxide layer 47 is formed in a window such that the tunnel diode portion 44 is separated by the active region from the thin tunnel oxide layer 47. The control gate portion 46 of the floating gate 42 extends over another and separate portion of the active region, but is separated from the active region by a high voltage oxide at a thickness of approximately 350 ÅA. A control gate 50 is disposed over the floating gate 42 in a non-stacked configuration, such that the control gate 50 will overlap the edges of the floating gate 42. This particular aspect of the structure is discussed in U.S. Pat. No. 5,225,700, issued Jul. 6, 1993, which U.S. Pat. No. 5,225,700 is incorporated herein by reference. One difference, however, over U.S. Pat. No. 5,225,700, is that an overlapping portion of the control gate 50, labelled 52, provides a merged pass gate as a gate structure, as will be described in more detail hereinbelow.

The control gates 50 of the transistors 30 and 32 comprise a portion of a Word Line 54, and the control gates 50 of the transistors 34 and 36 comprise a portion of a Word Line 56. Each of the drain diffusion regions 40 have a contact 58 formed therein and each of the source diffusion regions 38 have a contact 60 formed therein. Upper level metal layers are formed to provide a Bit Line 62 and a virtual ground line 64, illustrated in phantom. The metal Bit Line 62 is operable to interface with the drain diffusion regions 40 for all the transistors in the associated column and the virtual ground line 64 operable to interface with the source diffusion regions 38 in the transistors in the associated column.

Figure 4:
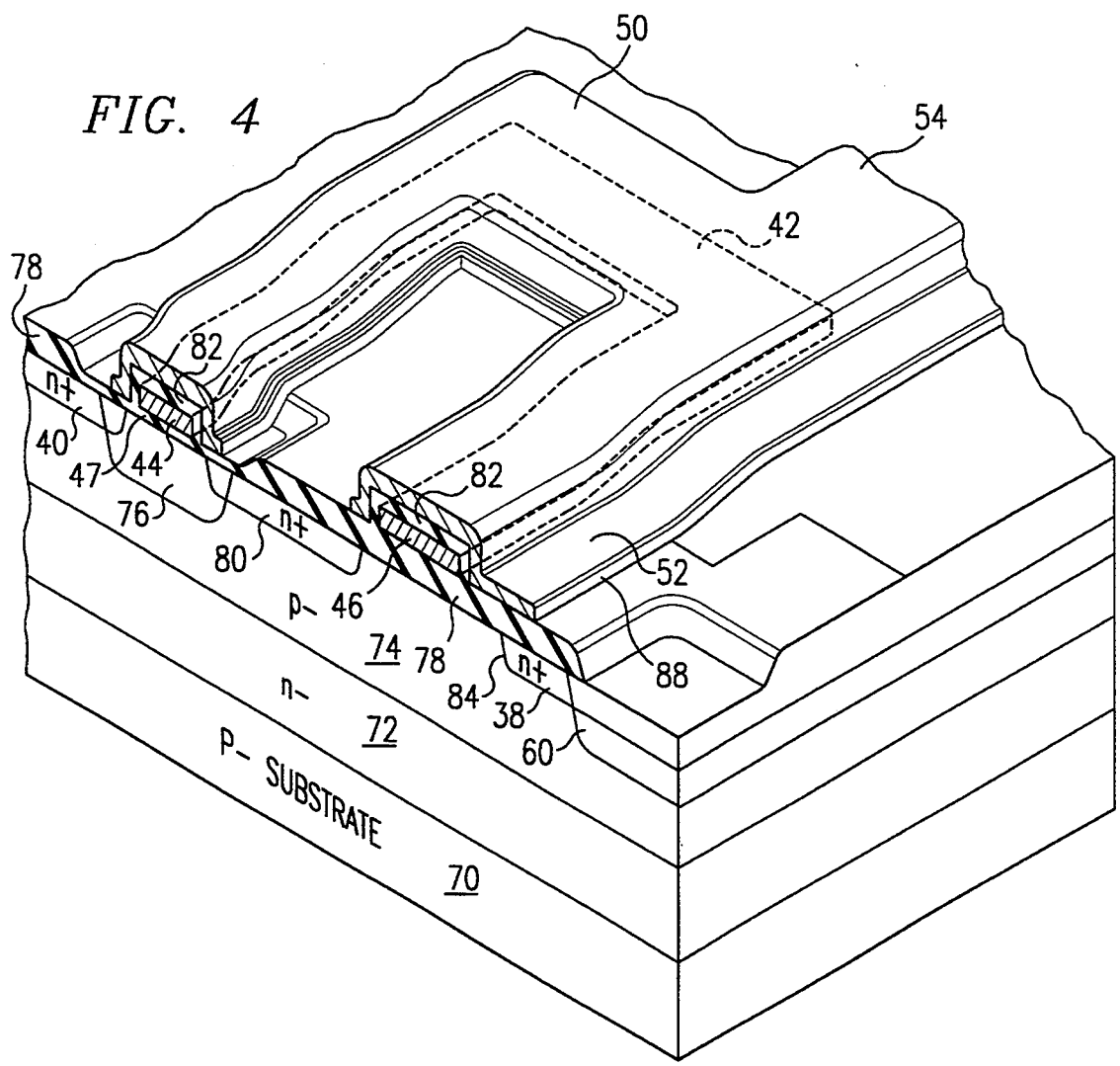
FIG. 4 illustrates a cross-sectional perspective view for one of the EEPROM memory cells.

Referring now to FIG. 4, there is illustrated a cross-sectional perspective view of one of the memory cells in FIG. 3 at the second poly level. During fabrication, a P— type substrate 70 is provided which has a high voltage N— tank 72 formed therein. In this high voltage N— tank 72 is formed a low voltage P— tank 74 which is surrounded by the N— tank 72, and which P— tank 74 contains the memory cell transistor 24. The N— tank 72 and the P— tank 74 are formed by first masking off the portions of the chip with the exception of the areas in which the tanks are to be formed. Thereafter, N— type material is implanted in a high energy level. A second mask is then disposed over the substrate to define an area within the N— tank 72. A low voltage P-implant is then formed in this second masked-off area, for example, with boron at about $1\times10^{14}$ ions/cm$^2$ and at an implant energy of approximately 40 KeV, to establish a low voltage P— tank 74. The substrate 70 is then subjected to a driving step to drive tanks 72 and 74 into the substrate, tank 72 being driven deeper into the substrate than tank 74.

After formation of the N— tank 72 and the P— tank 74, a moat pad oxide and a moat pad nitride (not shown) are deposited, patterned and etched. A layer of photoresist (not shown) is then deposited and patterned to define the channel stop implantation which takes place on the periphery of the memory cell. After the channel stop photoresist layer is stripped, LOCOS oxide (not shown) is grown on the surface of the epitaxial layer on those places not masked by the nitride/oxide layer to define the active region.

After formation of the LOCOS oxide, a dummy oxide (not shown) is grown within the P— tank 74, at least in an area surrounding the area to become the tunnel oxide layer 47. A tunnel diode implant of phosphorous is then performed through this dummy oxide (not shown). For example, with phosphorous at a dose of about $5.0\times10^{14}$ ions/cm$^2$ and at an implantation energy of approximately 100 KeV. This forms an implant region 76. The dummy oxide (not shown) is then etched away. On the surface of the exposed semiconductor epitaxial layer, a transistor gate insulator layer is then grown to a depth of, for example, 350 Å to provide an oxide layer 78. This oxide layer is then stripped away within the window that will contain the tunnel oxide layer 47 and then the tunnel oxide layer 47 grown therein to a depth of approximately 100 Å.

After formation of the oxide layers, a first layer of polycrystalline silicon (poly) is deposited onto the substrate at a thickness of approximately 2,000 Å. This layer is then patterned and etched to form the floating gate 42 with the tunnel diode portion 44 and the control gate portion 46 extending over the active region. An interlevel nitride and oxide layer are then formed over the floating gate 42 on the exposed surface thereof.

A second-level poly layer is then deposited, doped, patterned and etched to define the control gate 50 and row line 54. Thereafter, a sidewall oxide and capping oxide (not shown) are disposed over the control gate 50. The sidewall oxide forms a self-aligned mask for later implants. After the sidewall oxide and capping oxide are formed, the exposed areas of the active region are then exposed to N+ source/drain implants of phosphorous and/or arsenic. This will form the N+ source region 38 and the N+ drain region 40 in addition to an N+ region 80 between the two extended portions of the control gate 50 that overlie the tunnel diode portion 44 and control gate portion 46 of the floating gate 42. However, it is important to note that the source region 38 has a channel side 84 that is aligned with the outermost edge 88 of the extension 52 of the control gate 50, this being disposed away from the edge of the control gate portion 46 of the floating gate 42. In the preferred embodiment, the extension 52 extends away from the edge of the floating gate by a distance of approximately 1 micron, or approximately three times the thickness of the first poly layer from which the floating gate was formed. As such, the channel will extend from the region 38 to the region 40 to form what is referred to as the "pass" transistor, as will be described hereinbelow.

Figure 5:
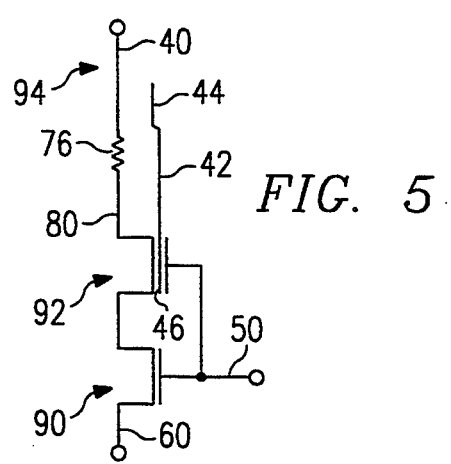
FIG. 5 illustrates an equivalent memory circuit for the EEPROM memory cell.

Referring now to FIG. 5, there is illustrated an equivalent circuit of the structure of FIG. 4. The equivalent circuit is comprised of a pass transistor 90, a floating gate transistor 92 and a tunnel diode 94. It can be seen that the pass transistor 90 is in series with the floating gate transistor 92. The floating gate transistor 92 is associated with the control gate portion 46 of the floating gate 42 and has associated therewith an oxide portion of approximately 350 Å. As such, Fowler-Nordheim electron tunneling will not occur in this portion of the floating gate 42. During a Write operation, the control gate 50 is disposed at a positive medium voltage and the source and drain disposed at a negative medium voltage to thereby put approximately +18 volts across the transistors. This will cause the floating gate 42 to become negatively charged as a result of tunneling across tunnel oxide layer 47. In order to change the programming state, i.e., to positively charge the floating gate, the control gate 50 is disposed at a negative medium voltage and the drain 40 disposed at a positive medium voltage, the source 60 allowed to float.

The floating gate transistor portion of the cell of FIG. 5 has a threshold voltage of approximately 0.5–1.0 volts, as opposed to the pass gate transistor 90 which has a threshold of 0.5–1.0 volts. However, the threshold voltage of the pass transistor 90 is "controllable", whereas the threshold voltage of a floating gate transistor 92, in combination with a tunnel diode 94, is a function of the charge on the floating gate. It could be as low of $-1.0$ volts or as high as 3.0 volts. If the pass gate structure 90 did not exist, the programming operation of the floating gate transistor 92 through the tunnel diode 94 would need to be controlled more closely to achieve low threshold voltages. The reason for this is that if the cell is to be utilized in low voltage systems, such as one having $V_{dd}$3.0 V, then the threshold voltage must be between 0.5–1.0 V in the "erase" mode, i.e., never allowed to go negative. Since the thresholds of these transistors are adjusted with a threshold implant, a distribution of thresholds will exist across the chip which can deviate as much as 0.5 volts. Therefore, it can be seen that it is relatively difficult to achieve low threshold voltages in a low voltage operation without allowing the transistor to have a negative threshold voltage, which would cause it to conduct, even when no control voltage is present on the control gate 50. However, by utilizing the merged pass gate structure of the present invention, the pass gate 90 can be merged into the memory cell with a single control gate 50 allowing the floating gate portion of the cell to have a negative threshold voltage, without the non-selected cell being conductive during a Read operation of an adjacent cell in an adjacent row.

Figure 6:
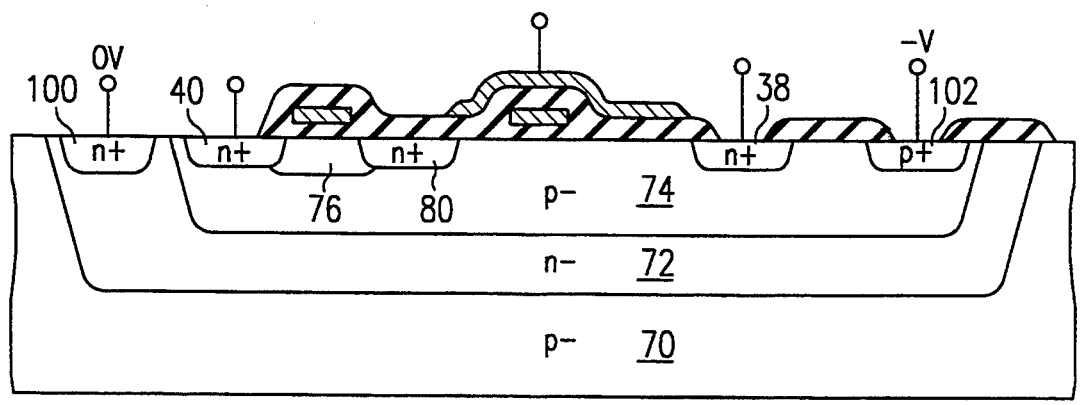
FIG. 6 illustrates across-sectional view of the memory cell illustrating the high voltage tank.

Referring now to FIG. 6, there is illustrated a detail of the N— high voltage tank 72 and the P— low voltage tank 74. The N— tank 72 has an N+ contact region 100 associated therewith and connected to a ground or zero voltage, and the P— tank 74 has associated therewith a P+ contact region 102 for contacting a negative voltage that is more negative than any voltage that will be applied to any of the regions 38, 40, or 80. As such, the PN junction between the N− tank 72 and P− tank 74 will be reverse biased and the PN junction between the regions 38, 40, or 80 and P− tank 74 will be reverse biased and, therefore, this will allow negative voltages to be applied to either the region 38, region 40 or region 80 without causing conduction to the substrate.

Figure 7:
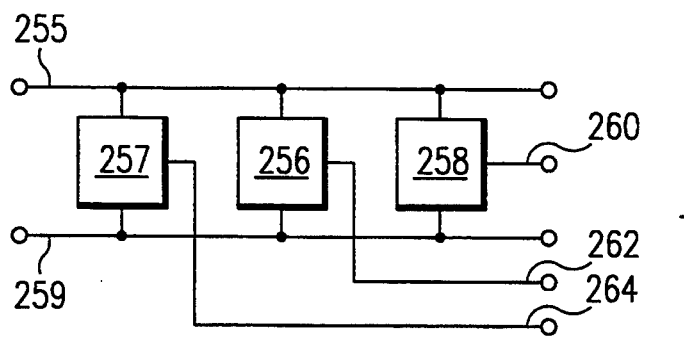
FIG. 7 illustrates a block diagram of the electrical circuit for providing the various voltage levels required by each cell.
Figure 8:
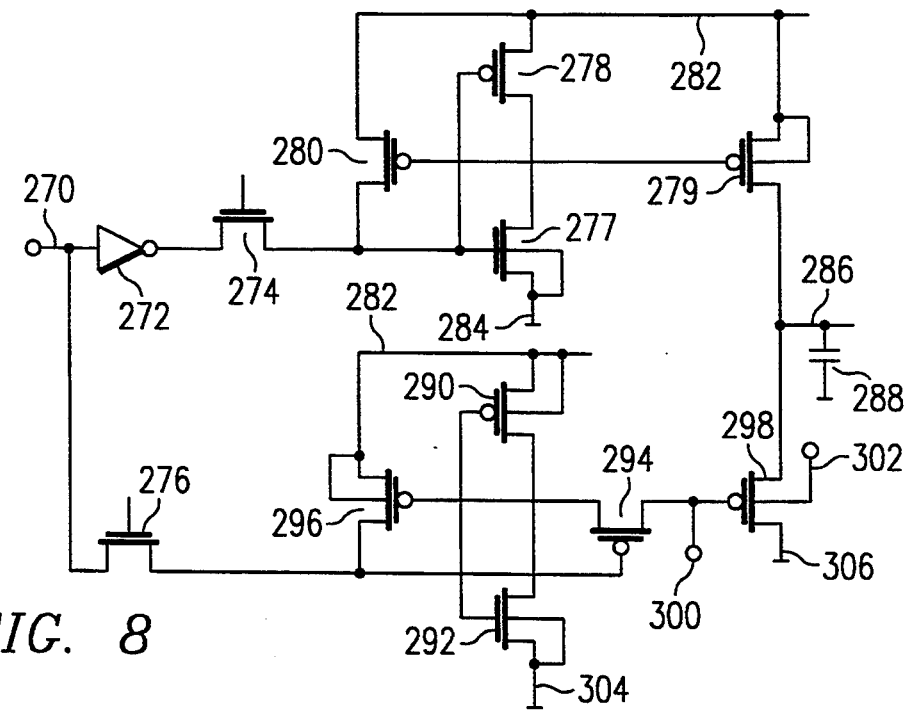
FIG. 8 illustrates a schematic diagram of the circuit for driving each Word Line of the array.

The circuitry required to drive the cells 24 illustrated in FIG. 2 is indicated by FIGS. 7 and 8. FIG. 7 shows in block diagram form the circuit required to produce the bipolar voltage levels required while FIG. 8 shows a switching circuit required to drive each line with a voltage required for a particular mode of operation.

In FIG. 7, a single voltage source of, for example, 5 volts is used as an input along line a 255 with a line 259 being ground or substrate voltage. Three charge pumps 257, 256 and 258 the design of which are well known in the art are coupled in parallel across lines 258 and 259. Each charge pump 257, 256 and 258 produces output voltages $-V_{gg}$, $-V_{pp}$ and $+V_{pp}$ on associated output lines 264, 262 and 260, respectively.

The circuit of FIG. 8 functions in response to input control signals received on input line 270 which are fed in parallel to an inverter 272 and through the source-to-drain of a field effect transistor 276 whose gate is at $V_{dd}$ or +5 volts. The inverter 272 output also passes through a field effect transistor 274 whose gate is at $V_{dd}$ or +5 V. The output from transistor 274 couples in parallel to the gates of an N-channel transistor 277 and a P-channel transistor 278 and to the drain of a P-channel transistor 280 to which the source of transistor 280 connects to the $V_{pp}$ line 282 and its gate connects to the drain of transistor 277. The source of transistor-277 is connected to ground at a $V_{ss}$ line 284 while the source of transistor 278 is connected to the $V_{pp}$ line 282.

The output from transistor 276 couples to the gates of transistors 290, 292 and 294, with transistors 290 and 294 being P-channel transistors. The drains of transistors 290 and 292 couple to the gate of transistor 296 and to the source of transistor 294. The drain of transistor 294 couples both to a $V_{gg}$ line 300 and to the gate of a P-channel transistor 298. Transistor 296 has the source thereof connected to the $V_{pp}$ line 282 and the drain thereof connected an output of transistor 276. The source of transistor 290 connects to the $V_{pp}$ line 282 while the source of transistor 292 is connected to the $V_{ss}$ line 104.

Output transistor 279 has the source thereof connected to the $V_{pp}$ line 282 and the drain thereof connected to the output line 286 while its complementary driver transistor 298 has the drain thereof connected to the $-V_{pp}$ line 306 and the source thereof connected to the line 286. Line 286 is charged and discharged by output capacitor 288 connected to $V_{ss}$.

In operation, a zero voltage input on input line 270 results in a positive signal at the output of inverter 272 which is applied to the gates of transistors 277 and 278. In response, transistor 277 turns on grounding the gates of transistors 279 and 280 and turning on both of the latter. Thus, transistor 279 in turning on connects the $V_{pp}$ line 282 to the output line 286. The charge pump 258 is operative to charge capacitor 288 to $+V_{pp}$. Simultaneously, transistor 280 couples $V_{pp}$ line 282 to the gates of transistors 277 and 278 thereby maintaining transistor 277 in an ON state and ensuring that there is no net voltage across the source-gate of transistor 278 so that the latter is cut off. Transistor 274 blocks the transmission of $V_{pp}$ to the output of inverter 272. Thus, capacitor 288 is charged through the channel resistance of transistor 279 to $V_{pp}$.

A zero output applied through transistor 276 turns on transistors 290 and 294 coupling $+V_{pp}$ on line 282 to the gate of transistor 298 and maintaining the latter OFF.

With an input signal at a logic "1", inverter 272 applies a logic "0" signal to the gates of transistors 277 and 278 turning on transistor 278 and applying $V_{pp}$ on line 282 to the gate of transistor 279. Transistor 279 is thus turned and/or maintained OFF.

An input signal at the logic "1" state turns on transistor 92 which applies zero volts to the source of transistor 292 and maintains the latter off. The $-V_{gg}$ and $-V_{pp}$ charge pumps 257 and 256 are then activated and transistor 298 turns on charging line 286 towards $-V_{pp}$. At the same time the $V_{pp}$ line 282 is tied to $V_{dd}$ lines 255.

Clearly, a variety of different voltages could be produced by the circuit of FIG. 7 depending upon the requirements. For the cells of FIG. 1, the combination +18 v, +9 V, −9 V, 3.0 v, and −3 v would be appropriate for the Bit Line and/or Word Line and a negative voltage for the P− tank 76.

In summary, there has been provided a Flash EEPROM memory array utilizing a merged pass gate/floating gate memory cell. The memory cell includes a non-stacked structure wherein a floating gate is provided having two portions, one portion for overlying an active transistor region to form a floating gate transistor with a relatively thick gate oxide and one portion overlying the active region with a relatively thin tunnel oxide to form a tunnel diode region. This tunnel diode region will allow Fowler-Nordheim tunneling to occur. A control gate structure overlies the floating gate structure such that it overlaps the edges thereof. On one side of the floating gate transistor, there is a significant overlap of the control gate structure over the channel region such that the channel region is extended beyond the edge of the floating gate structure and a pass gate; structure is formed. This pass gate structure forms the pass gate in series with the floating gate cell.

Although the preferred embodiment has been described in detail, it should be understood that various changes, substitutions and alterations can be made therein without departing from the spirit and scope of the invention as defined by the appended claims.

What is claimed is:

1. A Flash EEPROM memory having a memory array of EEPROM memory cells arranged in rows and columns on the face of a semiconductor substrate of a first conductivity type, the memory cells each comprising:

an active region having a channel region defined therein;

a source region defined in said active region on one side of said channel region;

a drain region formed on the other side of said channel region opposite said source region;

a floating gate structure having a control gate portion extending over a first portion of said channel region and a tunnel diode portion extending over a second portion of said channel region;

a tunnel oxide layer disposed between said tunnel diode portion and said channel region to allow for Fowler-Nordheim electron tunneling therethrough;

a gate oxide layer disposed between said control gate portion and said channel region; and a control gate structure having a first portion disposed over said floating gate structure and separated therefrom by a layer of interlevel oxide, and having a second portion that extends from said first portion of said control gate structure over a portion of said channel region, such that said second portion of said control gate structure forms a pass transistor in series with a floating gate cell formed by said first portion of said control gate structure.

2. The memory of claim 1, wherein the tunnel diode portion of said floating gate structure extends over a portion of said channel region adjacent said drain region.

3. The memory of claim 2, wherein said drain region comprises:

a first doped region of a second conductivity type material opposite to the first conductivity type material and abutting said channel region;

a tunnel diode region doped with said second conductivity type material and disposed adjacent to said first doped region;

a second doped region of said second conductivity type material disposed adjacent said tunnel diode region opposite said first doped region, said tunnel diode portion of said floating gate structure extending over said tunnel diode region and separated therefrom by said tunnel oxide layer wherein said tunnel diode region has a higher resistance than said first and second doped regions.

4. The memory of claim 1, wherein said floating gate structure includes a coupling portion disposed between said tunnel diode portion and said control gate portion and disposed outside of said active region.

5. The memory of claim 1, wherein said gate oxide layer is thicker than said tunnel oxide layer.

6. The memory of claim 1, wherein said floating gate structure comprises a first layer of polycrystalline silicon material and said control gate structure comprises a second layer of polycrystalline silicon material and wherein said second polycrystalline silicon layer overlaps substantially all edges of said first polycrystalline silicon layer forming said floating gate structure.

7. The memory of claim 1, wherein said floating gate structure comprises a first layer of conductive material and said control gate structure comprises a second layer of conductive material wherein the width of said overlapping portion of said control gate structure is greater than three times the thickness of said first layer.

8. The memory of claim 1, wherein said overlapping portion of said control gate structure extends outward from said floating gate structure on the opposite side of said channel region from said tunnel diode portion of said floating gate structure.

9. The memory of claim 1, wherein said active region is disposed in a first tank of first conductivity type material that is biased at a voltage to prevent reverse biasing of the semiconductor junction between any of said source or drain regions and said tank; and said first tank disposed within a second tank of second conductivity type material to separate said first tank from the substrate, said second tank biased at a voltage to prevent forward biasing of the semiconductor junction between said first tank and said second tank.

* * * * *